(12) United States Patent
Zhang

(10) Patent No.: US 10,848,605 B2
(45) Date of Patent: Nov. 24, 2020

(54) TERMINAL

(71) Applicant: GUANGDONG OPPO MOBILE TELECOMMUNICATIONS CORP., LTD., Guangdong (CN)

(72) Inventor: Haiping Zhang, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 0 days.

(21) Appl. No.: 16/563,228

(22) Filed: Sep. 6, 2019

(65) Prior Publication Data

US 2019/0394315 A1    Dec. 26, 2019

Related U.S. Application Data

(63) Continuation of application No. PCT/CN2018/075328, filed on Feb. 5, 2018.

(30) Foreign Application Priority Data

Mar. 7, 2017   (CN) .......................... 2017 1 0132062
Mar. 7, 2017   (CN) ...................... 2017 2 0219847 U

(51) Int. Cl.
*H04M 1/02* (2006.01)
*H05K 1/18* (2006.01)
*H05K 5/00* (2006.01)

(52) U.S. Cl.
CPC ....... *H04M 1/0264* (2013.01); *H04M 1/0266* (2013.01); *H05K 1/181* (2013.01); *H05K 5/0017* (2013.01); *H05K 2201/10128* (2013.01)

(58) Field of Classification Search
CPC .............. H04M 1/0264; H04M 1/0266; H05K 5/0017; H05K 1/181; H05K 2201/10128;
(Continued)

(56) References Cited

U.S. PATENT DOCUMENTS

2010/0273530 A1* 10/2010 Jarvis ................... G02B 6/0081
                                                        455/566
2014/0225131 A1   8/2014 Benson et al.
(Continued)

FOREIGN PATENT DOCUMENTS

CN   205809927   12/2016
CN   205812103   12/2016
(Continued)

OTHER PUBLICATIONS

EPO, Office Action for EP Application No. 18764579.1, dated Jan. 7, 2020.
(Continued)

*Primary Examiner* — Lewis G West
(74) *Attorney, Agent, or Firm* — Hodgson Russ LLP

(57) ABSTRACT

A terminal is provided, in accordance with the embodiments of the present discloser. The terminal includes a support, a display panel, a camera module and a sensor module. The display panel is opposite to the support. The camera module and the sensor module are disposed on the support. The display panel defines at least one recess. The sensor module and the camera module are disposed adjacently for determining a distance between the terminal and an external object.

20 Claims, 12 Drawing Sheets

(58) Field of Classification Search
CPC .... G06F 1/1626; G06F 1/1688; G06F 1/1686; G06F 1/1637
See application file for complete search history.

(56) References Cited

U.S. PATENT DOCUMENTS

| | | | | |
|---|---|---|---|---|
| 2016/0195905 | A1* | 7/2016 | Wang | G06F 1/3265 |
| | | | | 361/679.21 |
| 2016/0357433 | A1* | 12/2016 | Song | G06F 1/1637 |
| 2017/0085764 | A1 | 3/2017 | Kim et al. | |
| 2018/0067212 | A1* | 3/2018 | Wilson | G06F 1/1684 |

FOREIGN PATENT DOCUMENTS

| | | |
|---|---|---|
| CN | 106293444 | 1/2017 |
| CN | 106453726 | 2/2017 |
| CN | 106708201 | 5/2017 |
| CN | 206584269 | 10/2017 |
| EP | 3109727 | 12/2016 |

OTHER PUBLICATIONS

WIPO, ISR and WO for PCT/CN2018/075328, May 9, 2018.
USPTO, Office Action for U.S. Appl. No. 16/889,219, dated Jul. 2, 2020.

* cited by examiner

TERMINAL

CROSS-REFERENCE TO RELATED APPLICATION

This application is a Continuation application of a PCT application No. PCT/CN2018/075328, filed on Feb. 5, 2018, titled "TERMINAL" which claims priority to Chinese application No. 201710132062.1 filed on Mar. 7, 2017, titled "TERMINAL", and Chinese application No. 201720219847.8 filed on Mar. 7, 2017, titled "TERMINAL". The entirety of the above-mentioned applications are hereby incorporated by reference herein.

TECHNICAL FIELD

The present disclosure relates to the field of communication technology in general. More particularly, and without limitation, the disclosed embodiments relate to a terminal.

BACKGROUND

A display panel of a terminal may include a display region and a non-display region. The non-display region is disposed on the display region. A length of the non-display region is equal to that of the display region. Because the non-display region is configured to take a place for components of the terminal such as a front camera, a telephone receiver, sensors, and other electrical components, the non-display region should have a large size in width, which makes a ratio of the display region to the display panel be small.

SUMMARY

The present disclosure provides a terminal, to increase a ratio of the display region to the display panel.

In accordance with an embodiment of the present disclosure, the terminal includes a display panel, a camera module, and a sensor module. The display panel defines at least one recess. The camera module is disposed in the at least one recess. The sensor module is disposed adjacent to the camera module. The sensor module is configured to detect a distance between the terminal and an external object.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION OF EMBODIMENTS

Figure 1:
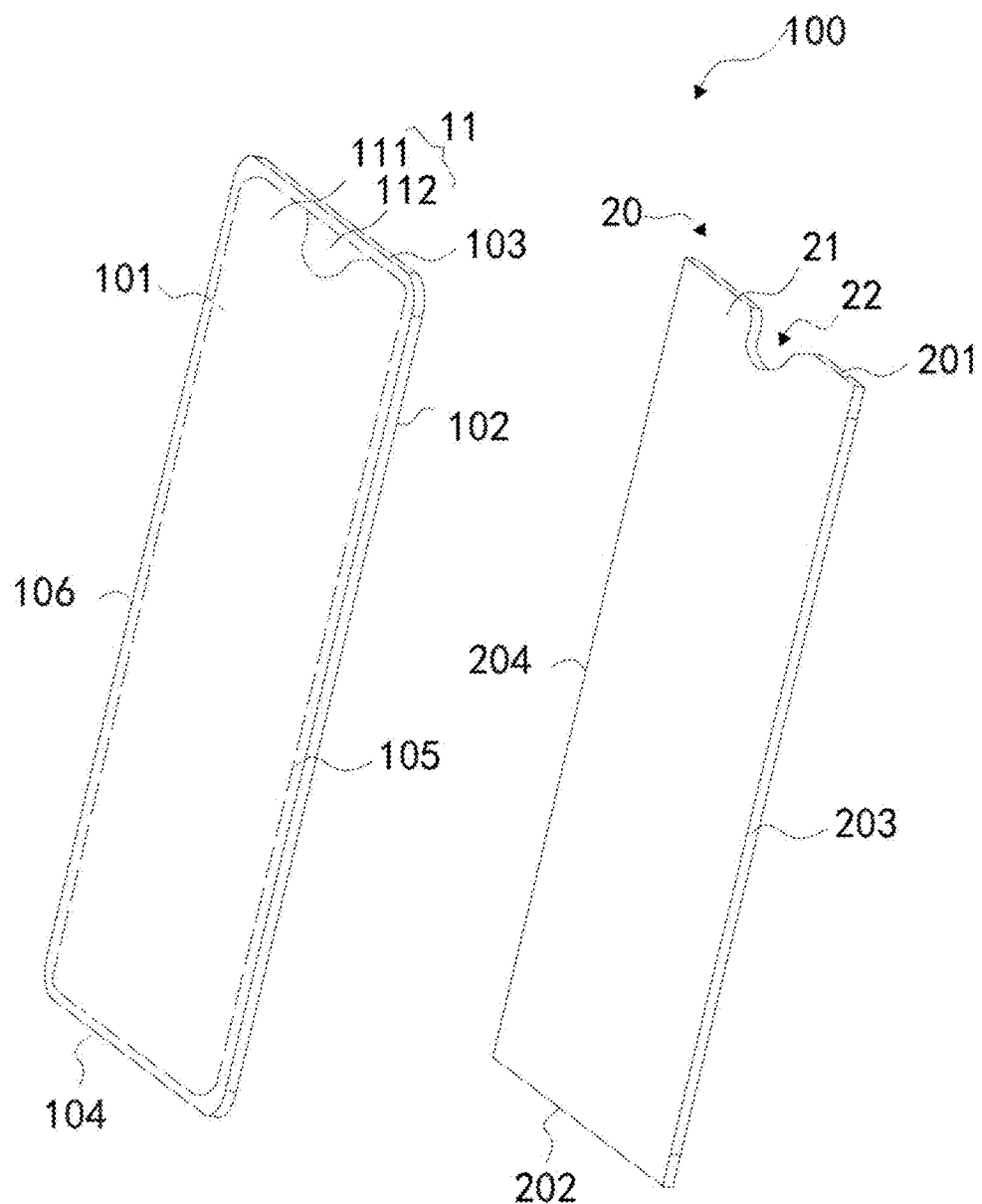
FIG. 1 illustrates a schematic exploded perspective view of a display device, in accordance with an embodiment of the present disclosure.

The technical solutions in the illustrating embodiments of the present disclosure are clearly and completely described in the following with reference to the drawings, in accordance of embodiments of the present disclosure. It may be noted that the described embodiments are only some of the embodiments of the present disclosure, but not all of the embodiments. All other embodiments obtained by those skilled in the art based on the embodiments of the present disclosure without creative efforts are considered as involving in the scope of the present disclosure.

The directional terms mentioned in this disclosure, such as "upper", "lower", "before", "behind", "left", "right", "inside", "outside", "beside", etc., are for reference serving the description and refers to the direction in the drawing. Therefore, the directional terms is for the purpose of illustration and understanding, and is not intended to limit the present disclosure.

As illustrated in FIG. 1 to FIG. 18, similar or identical components are represented by a same reference numeral.

As illustrated in FIGS. 1 to 4, a display device 100 is provided, in accordance with an embodiment of the present disclosure. The display device 100 includes a display panel 20 and a cover 10.

The display panel 20 includes a display region 21 and defines at least one recess 22. The display region 21 of the display panel 20 is configured to display information such as images, text, and other information. The at least one recess 22 is defined in an upper edge of the display region 21 and extends in a direction toward the display region 21. The at least one recess 22 is configured to expose a camera module of the terminals, which is disposed behind the display panel 20.

In other embodiments, the recess 22 may also be entirely embedded in the display region 21. In other words, the recess 22 is completely surrounded by the display region 21, and the recess 22 may be defined in a shape of through hole. Furthermore, a shape of the recess 22 is not limited to the shape illustrated in FIG. 1, the shape and amount of recess 22 may be designed according to a number of camera module, and an arrangement manner of the camera module, which are not limited herein.

The cover 10 is disposed on and covers the display panel 20. In some embodiment, the cover body 11 can be disposed in a front side of the display panel 20. The cover 10 can be configured to protect a front surface of the display panel 20 and exposes the information displayed by the display panel 20 to outside. The cover 10 includes a cover body 11, a first attachment member 12, and a second attachment member 13.

The cover body 11 includes a transparent portion 111 and a functional portion 112. The transparent portion 111 of the cover body 11 is disposed corresponding to the display region 21 of the display panel 20. The transparent portion 111 is configured to allow light emitted by the display region 21 of the display panel 20 to penetrate, therefore information such as images and text may appear on the display device 100. The functional portion 112 of the cover body 11 is corresponding to the at least one recess 22. For example, the transparent portion 111 may be staked on front surface of the display region 21, and the functional portion 112 covers the recess 22.

A location, a shape and other parameters of the functional portion 112 of the cover body 11 may be designed according to parameters such as a location and a shape of the recess 22.

Figure 2:
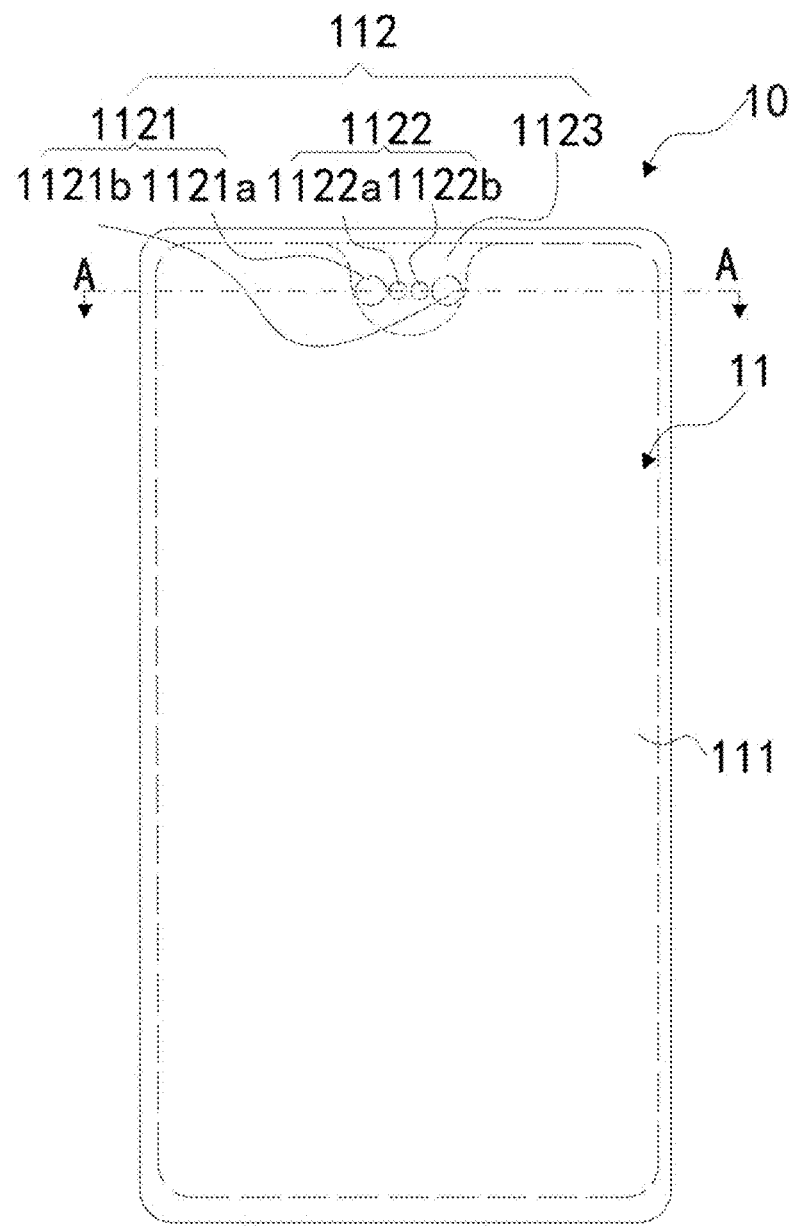
FIG. 2 illustrates a schematic projection view of a cover of the display panel of FIG. 1.

As illustrated in FIG. 2, in the illustrating embodiment, the functional portion 112 of the cover body 11 is located at an upper portion of the cover body 11. The functional portion 112 is partially embedded in the transparent portion 111 of the cover body 11. In other words, the functional portion 112 is at least partially surrounded by the transparent portion 111. The functional portion 112 is configured to block sight from outside. The functional portion 112 can be disposed in front of the recess 22 of the display panel 20. Such that the recess 22 of the display panel 20 is hidden. The functional portion 112 may include a light shielding layer, such as a black underlayer. Such that interior components of the terminal 100 may be shielded. In some embodiments, the light shielding layer is an ink layer. Thereby the functional portion 112 is a non-transparent portion of the cover 10.

Figure 4:
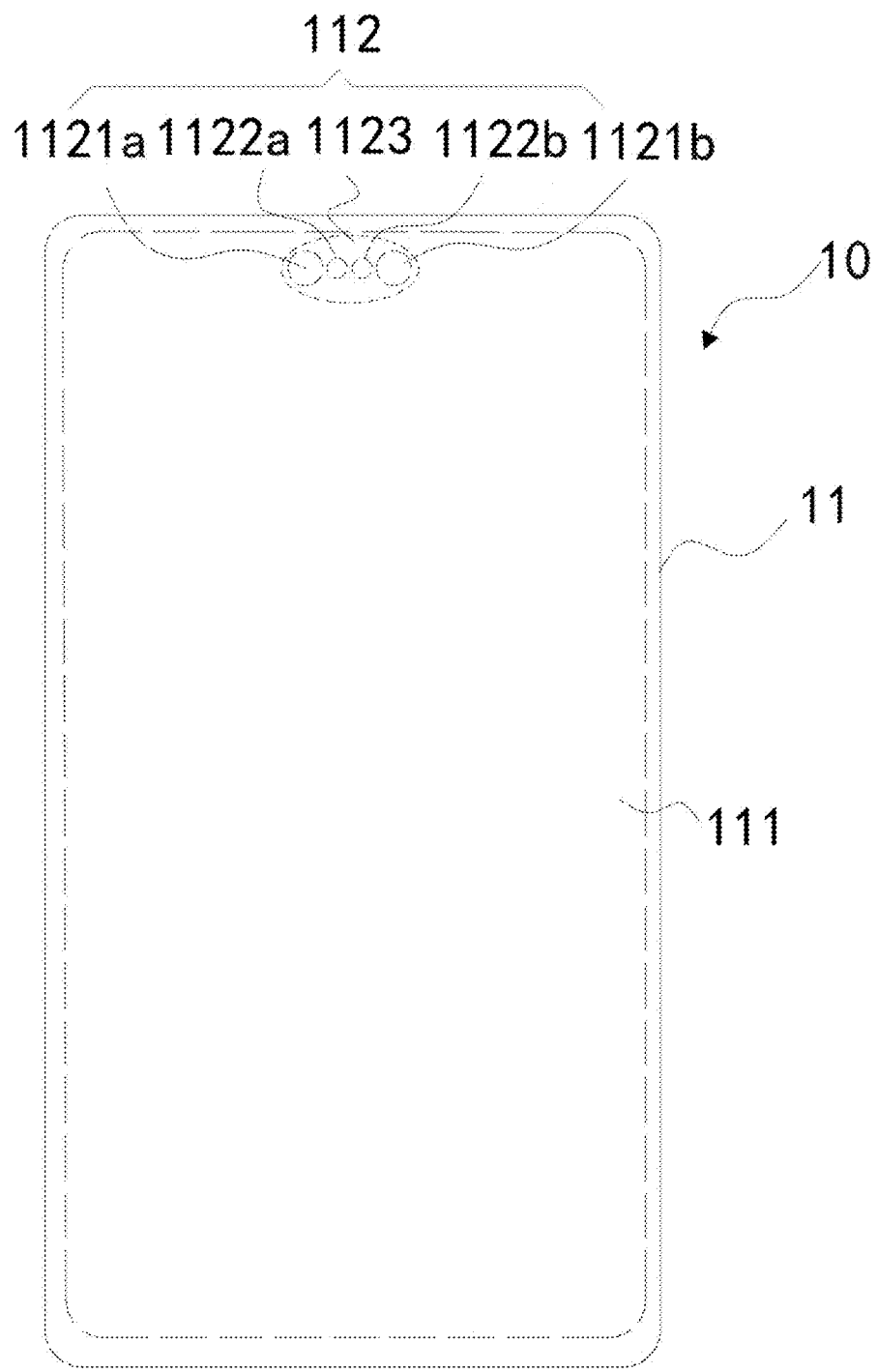
FIG. 4 illustrates a schematic projection view of a cover, in accordance with an embodiment of the present disclosure.

It may be understood that, in other embodiments, the functional portion 112 may also be completely embedded in the transparent portion 111, as illustrated in FIG. 4. The functional portion 112 is located in the transparent portion 111 as an island in the transparent portion 111, as illustrated in FIG. 4. Correspondingly, the recess 22 of the display panel 20 is a through hole defined in and surrounded by the display region 21.

In the illustrating embodiment, the functional portion 112 is located at an upper portion of the cover body 11. The transparent portion 111 is located at the remaining portion of the cover body 111 except for the functional portion 112.

In some embodiments, the cover 10 includes a top surface 101 and a bottom surface 102 opposite to the top surface 101. The bottom surface 102 is facing an interior space of the terminal. In the illustrated embodiment, the cover 10 is substantially rectangular, and includes a first side 103, a second side 104, a third side 1051, and a fourth side 106 (as shown in FIG. 1). The first side 103 is substantially parallel to the second side 104, and the third side 104 is substantially parallel to the fourth side 106. Each of the first side 103 and the second side 104 is connected between the third side 105 and the fourth side 106. In the present embodiment, each of the first side 103 and the second side 104 is shorter than either of the third side 105 and the fourth side 106. In an alternative embodiment, each of the first side 103 and the second side 104 may be longer than either of the third side 105 and the fourth side 106.

Figure 5:
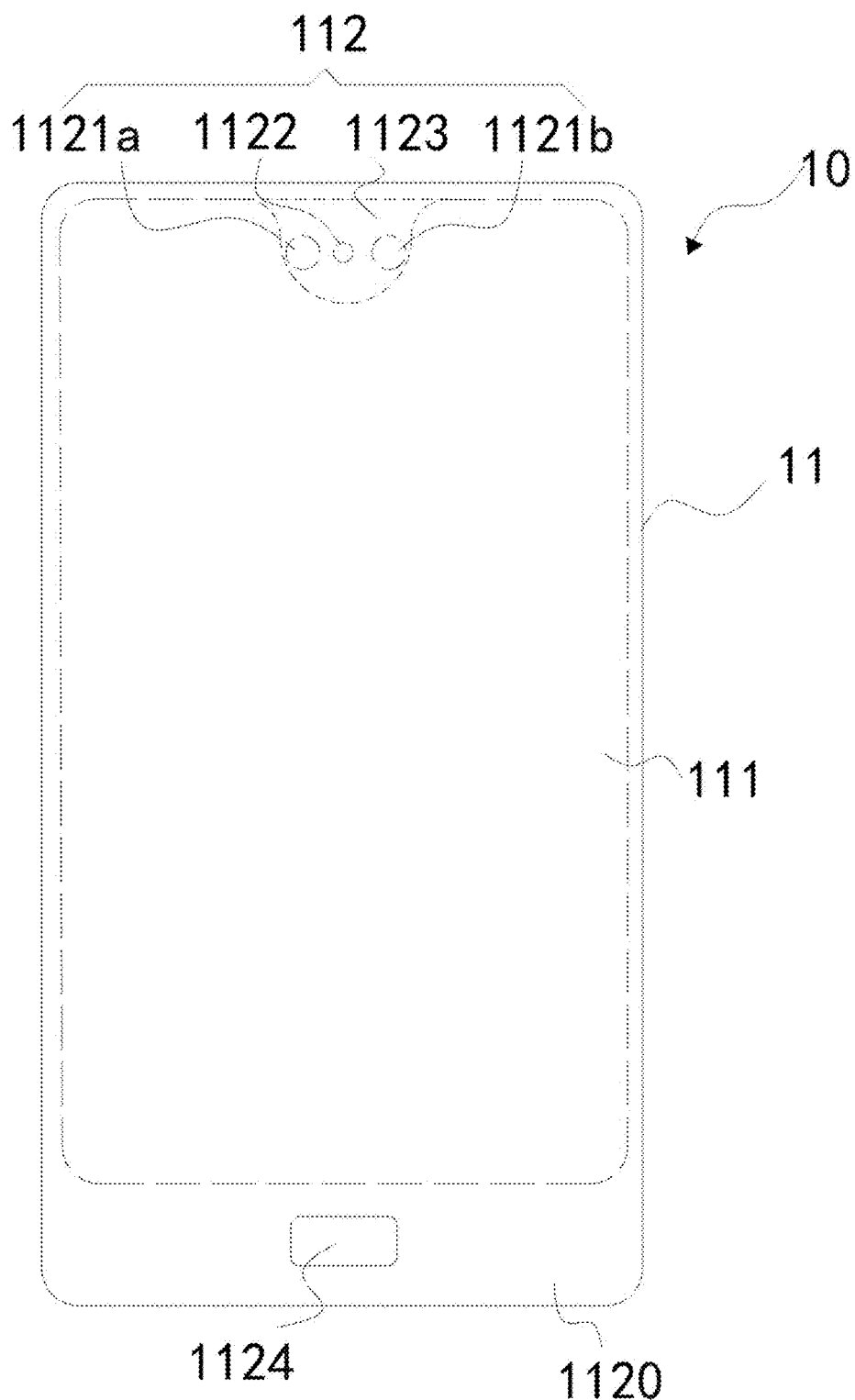
FIG. 5 illustrates a schematic projection view of a cover, in accordance with another embodiment of the present disclosure.

In some embodiment, the functional portion 112 is located adjacent to the first side 103 of the cover 10. In other embodiments, the cover body 11 may further include a shielding portion 1120 disposed on a lower portion of the cover body 11, as illustrated in FIG. 5. In the cover 10 illustrated in FIG. 5, the cover body 11 further provides another functional portion 112 in a lower portions of the cover body 11. That is, the shielding portion 1120 and the functional portion 112 are respectively disposed at opposite sides of the cover 10, and the shielding portion 1120 is located adjacent to the second side 104 of the cover 10. The functional portion 112 has a substantially elongated shape. The shielding portion 1120 may correspond to a fingerprint identification module of the terminal for performing the fingerprint identification function.

In an embodiment, the shielding portion 1120 defines a through hole 1124 therein. The through hole 1124 is configured to expose a touch-sensitive surface of the fingerprint identification module of the terminal. A user may touch the touch-sensitive surface and input a fingerprint to facilitate fingerprint identification. In other embodiments, the through hole 1124 may also be configured to receive component such as a physical button, which is not limited herein.

Furthermore, the through hole 1124 illustrated in FIG. 5 may have a rectangular shape. In other embodiments, the through hole 1124 may have other shapes such as a circle shape or an ellipse shape, and the shape of the through hole 1124 is not limited herein.

As illustrated in FIG. 2, in the illustrating embodiment, the functional portion 112 of the cover body 11 includes a first functional region 1121, a second functional region 1122, and a shielding region 1123.

When the cover 10 is applied to the terminal, the first functional region 1121 corresponds to the camera module of the terminal. The first functional region 1121 is configured to allow ambient light to penetrate and reach the camera module, such that the camera module may capture an image of objects outside the terminal.

In some embodiment, camera module may include two camera units, and therefore two first functional regions 1121 are provided. The two first functional regions 1121 are respectively labeled as the first functional region 1121a and the first functional region 1121b. The first functional region 1121a and the first functional region 1121b correspond to the two camera units, respectively.

In other embodiments, there may be only one first functional region 1121. In this case, the terminal may include one or more camera units. When there is one camera module in the terminal, the first functional region 1121 corresponds to the camera module. When there are two or more camera units in the terminal, the first functional region 1121 may correspond to the two or more camera units. In other words, two or more camera units may share one first functional region 1121, specific restrictions are not made here.

Figure 3:
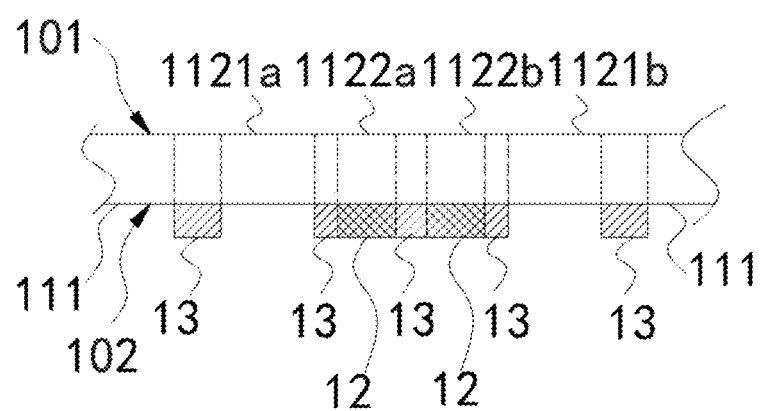
FIG. 3 illustrates a schematic cross-sectional view of the cover of FIG. 2, taken along a line A-A.

As illustrated in FIG. 3, FIG. 3 illustrates a schematic cross-sectional view of the cover 10 of FIG. 2, taken along a line A-A. In the illustrating embodiment, the first attachment member 12 is disposed on a side of the second functional region 1122 closed to an interior space of the terminal. The first attachment member 12 corresponds to a sensor module of the terminal.

In the cover 10 illustrated in FIG. 2 and FIG. 3, there are two second functional regions 1122 provided. The two second functional regions 1122 are respectively labeled as the second functional region 1122a and the second functional region 1122b. The second functional region 1122a and the second functional region 1122b are spaced apart from each other. Correspondingly, there are two first attaching members 12 provided, and the two first attaching members 12 are respectively disposed on the second functional region 1122a and the second functional region 1122b, and respectively correspond to two sensor modules of the terminal. In the illustrating embodiment, the sensor module may be a proximity sensor, or a light sensor, and which is not limited herein.

When the sensor module include a proximity sensor and/or a light sensor, the first attachment member 12 may be made from a material of far-infrared ink. A light transmittance of the first attachment member 12 is about 85% when light having wavelength of 850 nm penetrates the first attachment member 12. Because the far-infrared ink is black, internal components of the terminal may be shielded, and infrared waves may penetrate the first attachment member 12. Such that the proximity sensor and/or the light sensor can work normally. In other embodiments, the first attaching member 12 may also be made from other materials, which is not limited herein.

In other embodiments, as illustrated in FIG. 5, there may be only one second functional region 1122 provided. Correspondingly, only one first attaching member 12 is provided. The first attaching member 12 may be corresponding to one or more sensor modules.

In the illustrating embodiment, the shielding region 1123 is located at another portion of the functional portion 112, except for the first functional region 1121 and the second functional region 1122 in the functional portion 112.

In the cross-sectional view illustrated in FIG. 3, the second attachment member 13 is disposed on a side of the shielding region 1123 closed to the interior space of the terminal. The second attachment member 13 may be made from black ink, such that the internal components of the terminal may be shielded by the second attachment member 13. Because a transmittance of a black ink layer is substantially 0 when visible light penetrates the black ink, the second attachment member 13 may shied the internal components effectively. Therefore, the internal components of the terminal may not be seen by the user. In other embodiments, the second attachment member 13 may be made from other materials, which is not limited herein.

As illustrated in FIGS. 2 to 4, in the illustrating embodiment, the first functional regions 1121 and the second functional regions 1122 are arranged in a straight line. The second functional region 1122a and the second functional region 1122b are disposed between the first functional region 1121a and the first functional region 1121b. An arrangement of the first functional region 1121a, the first functional region 1121b, the second functional region 1122a, and the second functional region 1122b is not limited to that illustrated in FIGS. 2 to 4.

Figure 7:
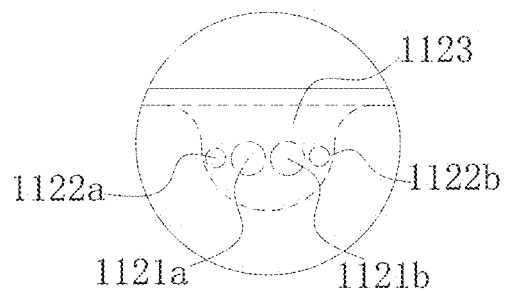
FIG. 7 illustrates a schematic projection view of a functional portion of the cover, in accordance with an embodiment of the present disclosure.

In an embodiment, as illustrated in FIG. 7, the first functional region 1121a and the first functional region 1121b are disposed between the second functional region 1122a and the second functional region 1122b. In other words, the two first functional regions 1121 are located between the two second functional regions 1122.

Figure 8:
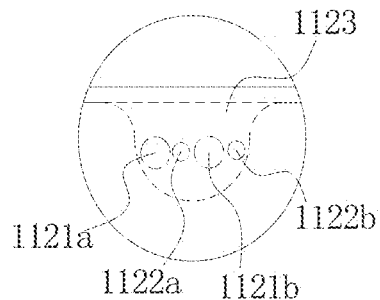
FIG. 8 illustrates a schematic projection view of a functional portion of the cover, in accordance with another embodiment of the present disclosure.

In an embodiment, the two second functional regions 1122 and the two first functional regions 1121 are arranged in an interval manner, as illustrated in FIG. 8. Only one arrangement is illustrated in FIG. 8 in which the two second functional regions 1122 and the two first functional regions 1121 are arranged in an interval manner. It may be understood that the two second functional regions 1122 and the two first functional regions 1121 may be arranged in another interval manner, for example, positions of the two first functional regions 1121 and positions of the two functional regions 1122 may be exchanged and another arrangement may be achieved.

Figure 9:
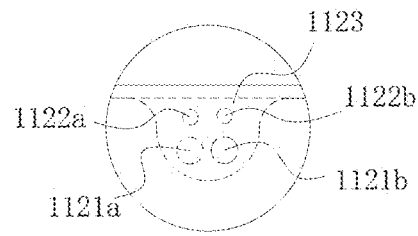
FIG. 9 illustrates a schematic projection view of a functional portion of the cover, in accordance with still another embodiment of the present disclosure.
Figure 10:
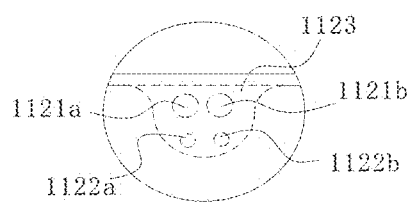
FIG. 10 illustrates a schematic projection view of a functional portion of the cover, in accordance with further another embodiment of the present disclosure.

In other embodiments, the first functional regions 1121 and the second functional regions 1122 may also not be arranged in a straight line. In an embodiment, the first functional regions 1121 and the second functional regions 1122 may also be arranged in a parallel manner, as illustrated in FIGS. 9 and 10.

In the functional portion 112 illustrated in FIGS. 9 and 10, the second functional region 1122a and the second functional region 1122b are located above or below the first functional region 1121a and the first functional region 1121b. As illustrated in FIG. 10, the second functional region 1122a and the second functional region 1122b are closer to the first side 103 of the cover 10, than the second functional region 1122a and the second functional region 1122b are located. For example, the second functional region 1122a and the second functional region 1122b are arranged in a first line, and the first functional region 1121a and the first functional region 1121b are arranged in a second line. The first line is located between the second line and the first side 103 of the cover 10.

It may be understood that the arrangements of the first functional regions 1121 and the second functional regions 1122 are not limited to the arrangements mentioned above. For example, the second functional region 1122a may be located at an upper eft corner of the first functional region 1121a, and the second functional region 1122b may be located at an upper right corner of the first functional region 1121b.

In some embodiments, when the arrangement of the first functional regions 1121 and the second functional regions 1122 is changed, the positions of the first attachments member 12 are also changed correspondingly, and shapes of the second attachment members 13 are also changed correspondingly.

Figure 11:
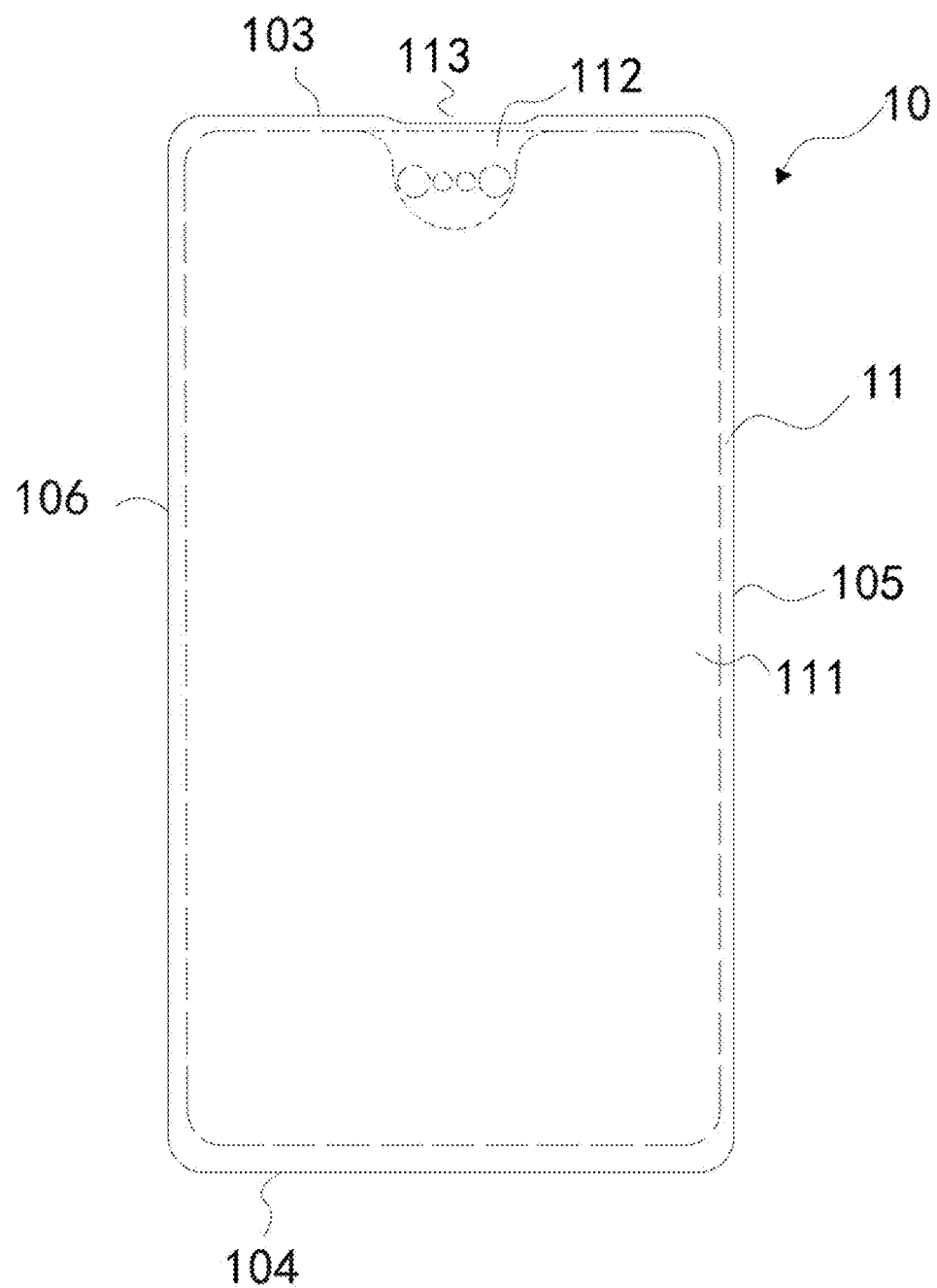
FIG. 11 illustrates a schematic projection view of a cover, in accordance with still another embodiment of the present disclosure.

In an embodiment, as illustrated in FIG. 11, a top portion of the cover body 11 may define a notch 113 therein, such that the sound emitted by the telephone receiver of the terminal may propagate. The notch 113 is located at an upper edge of the functional portion 112. When the cover body 11 is fastened to a housing of the terminal, the notch 113 and the housing cooperatively form a slit configured to allow the sound from a telephone receiver of the terminal to propagate. It may be understood that a shape of the notch 113 is not limited to the shape illustrated in FIG. 11, and the notch 113 may have a desired shape according to actual conditions, which is not limited herein. In some embodiments, the notch 113 is defined at the first side 103 of the cover 10, as illustrated in FIG. 11. The notch 113 passes through the cover 10 and aligned to a telephone receiver of the terminal. The telephone receiver is exposed from the notch 113.

In the display device 100 provided in the embodiments, an area of a non-display region of the display device 100 may be smaller, compared with ordinary display devices. A ratio of the display region to the display panel is larger. Thereby the terminal may be able to display via a display panel with a larger size.

A terminal is provided, in accordance with an embodiments of the present disclosure. The terminal includes a display panel, a camera module, and a sensor module. The display panel defines at least one recess therein, and the camera module is disposed in the at least one recess. The sensor module is disposed adjacent to the camera module for detect a distance between the terminal and an external object.

In some embodiments, the camera module includes a first camera unit and a second camera unit. The sensor module includes a first sensor and a second sensor.

In some embodiments, the sensor module and camera module are arranged in a straight line.

In some embodiments, the first sensor and the second sensor are disposed between the first camera unit and the second camera unit.

In some embodiments, the first sensor and the second sensor are arranged in an interval manner with the first camera unit and the second camera unit. In other words, two sensors and the two camera units are arranged in an interval manner.

In some embodiments, the first camera unit and the second camera unit are disposed between the first sensor and the second sensor.

In some embodiments, the first sensor and the second sensor are disposed below the first camera unit and the second camera unit, respectively. In some embodiment, the first camera unit is closer to an edge of the display panel than the first sensor. The second camera unit is closer to an edge of the display panel than the second sensor.

In some embodiments, the first sensor and the second sensor are disposed above the first camera unit and the second camera unit, respectively. In some embodiment, the first sensor is closer to an edge of the display panel than the first camera unit. The second sensor is closer to an edge of the display panel than the second camera unit.

In some embodiments, the first sensor includes a proximity sensor, and the second sensor includes a light sensor.

In some embodiments, the terminal further includes a telephone receiver disposed above the camera module and the sensor module. In some embodiment, the telephone receiver is closer to an edge of the display panel than the camera module and the sensor module.

In some embodiments, the terminal further includes a housing. The housing includes a bottom plate and a frame disposed at periphery of the bottom plate. The frame extends along a direction perpendicular to the bottom plate. The housing is configured to receive the camera module, the sensor module, and the telephone receiver. The frame defines sound outlets for allowing sound from the telephone receiver to propagate.

In some embodiments, the camera module includes a base and a lens. The base and the lens cooperatively form a step. The sensor module is disposed on the step.

In some embodiments, the terminal further includes a cover. The cover is disposed on the display panel. The cover includes a transparent portion and a functional portion. The transparent portion is corresponding to the display region, the functional portion is disposed corresponding to the at least one recess.

In some embodiments, the functional portion is at least partially surrounded by the transparent portion.

In some embodiments, the functional portion is entirely embedded in the transparent portion.

In some embodiments, the cover includes a cover body, a first attachment member, and a second attachment member. The functional portion includes a first functional region, a second functional region, and a shielding region. The first functional region is corresponding to the camera module, and the first functional region is configured to allow ambient light to penetrate and reach the camera module. The first attachment member is disposed on the second functional region and corresponds to the sensor. The second attachment member is disposed on the shielding region to shield the internal structure of the terminal.

In some embodiments, the first attachment member is made from a material including far infrared ink.

In some embodiments, the second attachment member is made of a material including black ink.

In some embodiments, the camera module includes a first camera unit and a second camera unit.

In some embodiments, the sensor module includes a first sensor and a second sensor.

As illustrated in FIGS. 1 to 11, a terminal 1000 is provided, in accordance with an embodiment of the present disclosure. The terminal 1000 includes a display device 100, a camera module 200, a sensor module 300, a telephone receiver 400, a circuit board 500, a battery 600, and a housing 700. The housing 700 defines a receiving space 701, and the display panel 20, the circuit board 500, and the battery 600 are received in the receiving space 400. The battery 600 is juxtaposed with the circuit board 500. In other embodiment, the circuit board 500 may be replaced by a support. In still another embodiment, the terminal 1000 further includes a support 501. The support 501 may be disposed in the housing. The circuit board 500, the camera module 200, and the sensor module 300 may be disposed on the support 501.

The display device 100 is disposed at a side of the circuit board 500 departing away from a bottom wall of the housing 700. As illustrated in FIG. 1, the display device 100 includes a cover 10 and a display panel 20. The display panel 20 is sandwiched between the cover 10 and the circuit board 30. The display panel 20 includes a display region 21 and defines at least one recess 22. The display region 21 of the display panel 20 is configured to display an interface. The recess 22 extends in the direction of the display region 21 along the upper frame of the display region 21. The at least one recess 22 is defined in an upper edge of the display region 21 and extends in a direction toward the display region 21. The recess 22 is configured to expose components of the terminal such as the camera module 200, which is disposed behind the display panel 20.

The display portion 21 may include a number of pixels so as to display an image. In this embodiment, the display panel 20 can be a liquid crystal display (LCD) display panel. A configuration of the display portion 21 may include a backlight module, a thin film transistor (TFT) array, a liquid crystal layer, a color filter, etc. In another embodiment, the display panel 20 can be an organic light-emitting diode (OLED) display panel, and the display portion 21 may include a number of components, i.e., a substrate, an anode layer, a hole-injection layer, an organic luminous layer, an electron-transport layer, a cathode layer, etc. In still another embodiment, the display panel 20 can be a LED display panel, and the display portion 21 may include a number of components, i.e., a LED array, a drive circuit, etc. In addition, the display panel 21 can be a rigid panel or a flexible panel.

In the illustrated embodiment, the display panel 20 is substantially rectangular, and includes a first edge 201, a second edge 202, a third edge 203, and a fourth edge 204 (as shown in FIG. 1). The first edge 201 is substantially parallel to the second edge 202, and the third edge 203 is substantially parallel to the fourth edge 204. Each of the first edge 201 and the second edge 202 is connected between the third edge 203 and the fourth edge 204. In the present embodiment, each of the first edge 201 and the second edge 202 is shorter than either of the third edge 203 and the fourth edge 204. In an alternative embodiment, each of the first edge 201 and the second edge 202 may be longer than either of the third edge 203 and the fourth edge 204. In some embodiment, the recess 22 may be defined at the first side 201 of the display panel 20. And the recess 22 may be at least partially surrounded by the display region 21.

In other embodiments, the recess 22 may also be entirely embedded in the display region 21. In other words, the recess 22 is completely surrounded by the display region 21, and the recess 22 may have a shape of through hole. Furthermore, a shape of the recess 22 is not limited to the shape illustrated in FIG. 1.

The cover 10 is disposed on and covers the display panel 20. In some embodiment, the cover body 11 can be disposed in a front side of the display panel 20. The cover 10 can be configured to protect a front surface of the display panel 20 and exposes the information displayed by the display panel 20 to outside. The cover 10 includes a cover body 11, a first attachment member 12 and a second attachment member 13.

In some embodiments, the cover 10 includes a top surface 101 and a bottom surface 102 opposite to the top surface 101. The bottom surface 102 is facing the display panel 20 and is attached to the display panel 20. In the illustrated embodiment, the cover 10 is substantially rectangular, and includes a first side 103, a second side 104, a third side 1051, and a fourth side 106 (as shown in FIG. 1). The first side 103 is substantially parallel to the second side 104, and the third side 104 is substantially parallel to the fourth side 106. Each of the first side 103 and the second side 104 is connected between the third side 105 and the fourth side 106. In the present embodiment, each of the first side 103 and the second side 104 is shorter than either of the third side 105 and the fourth side 106. In an alternative embodiment, each of the first side 103 and the second side 104 may be longer than either of the third side 105 and the fourth side 106.

When the cover 10 is attached to the display panel 20, the first side 103 is adjacent and substantially parallel to the first edge 201, the second side 104 is adjacent and substantially parallel to the second edge 202, the third side 105 is adjacent and substantially parallel to the third edge 203, and the fourth side 106 is adjacent and substantially parallel to the fourth edge 204.

The cover body 11 includes a transparent portion 111 and a functional portion 112. The transparent portion 111 of the cover body 11 is disposed corresponding to the display region 21 of the display panel 20. The transparent portion 111 is configured to allow light emitted by the display region 21 of the display panel 20 to penetrate, therefore information such as images and text may appear on the display device 100. The functional portion 112 of the cover body 11 is disposed at the first side 103 and corresponding to the at least one recess 22. For example, the transparent portion 111 may be staked on front surface of the display region 21, and the functional portion 112 covers the recess 22. A location, a shape and other parameters of the functional portion 112 of the cover body 11 may be designed according to parameters such as a location and a shape of the recess 22.

As illustrated in FIG. 2, in the illustrating embodiment, the functional portion 112 of the cover body 11 is located at an upper portion of the cover body 11. The functional portion 112 is partially embedded in the transparent portion 111 of the cover body 11. In other words, the functional portion 112 is at least partially formed in the transparent portion 111, and the functional portion 112 is at least partially surrounded by the transparent portion 111. The functional portion 112 is configured to block sight from outside. The functional portion 112 can be disposed in front of the recess 22 of the display panel 20. Such that the recess 22 of the display panel 20 is hidden. The functional portion 112 may include a light shielding layer, such as a black underlayer. Such that interior components of the terminal 100 may be shielded. In some embodiments, the light shielding layer is an ink layer. Thereby the functional portion 112 is a non-transparent portion of the cover 10.

It may be understood that, in other embodiments, the functional portion 112 may also be entirely surrounded by the transparent portion 111, as illustrated in FIG. 4. In FIG. 4, the functional portion 112 is located in the transparent portion 111 as an island in the transparent portion 111.

Figure 6:
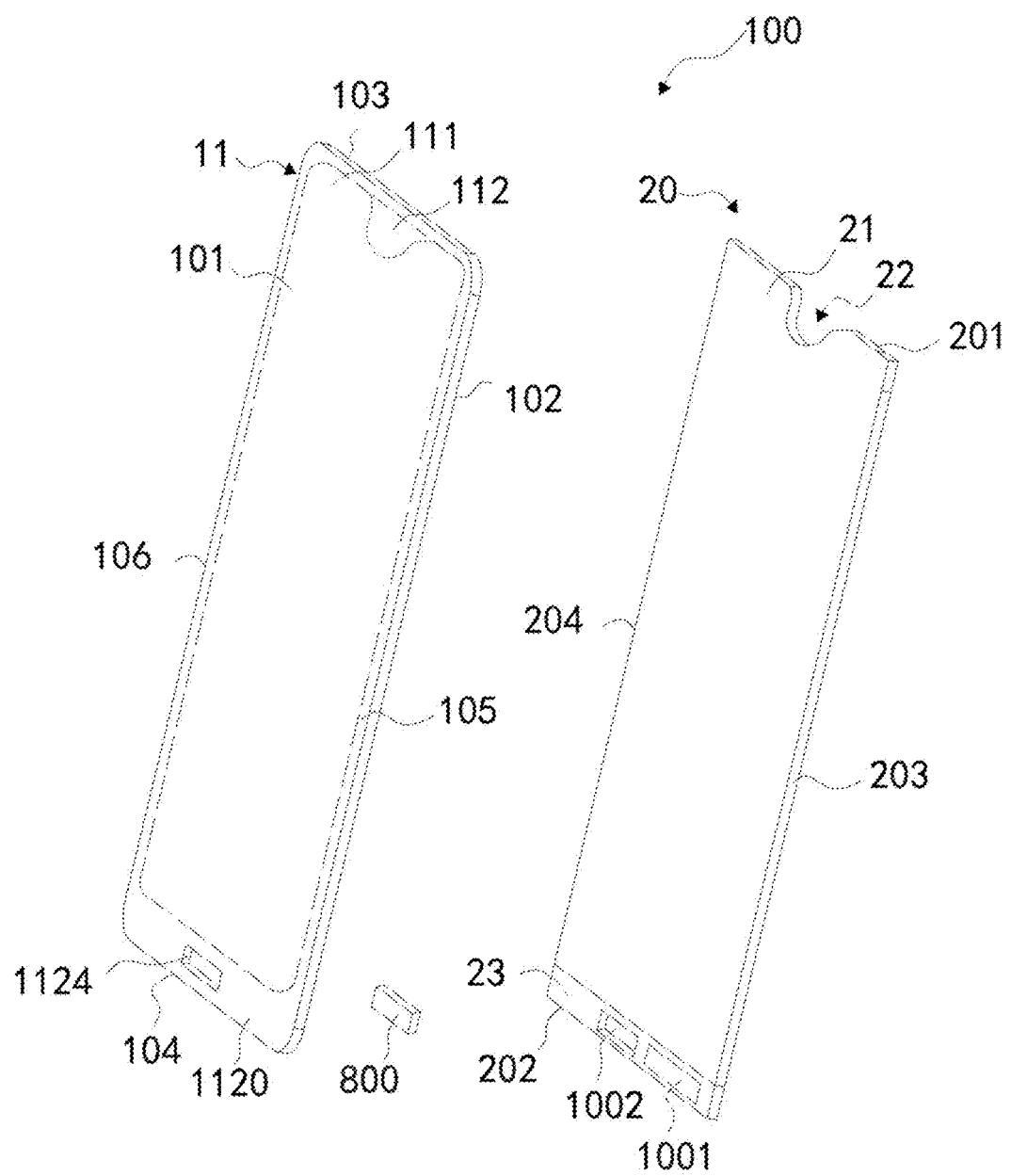
FIG. 6 illustrates a schematic exploded perspective view of a display device, in accordance with another embodiment of the present disclosure.

In other embodiments, the cover body 11 may further include a shielding portion 1120 disposed on a lower portion of the cover body 11, as illustrated in FIGS. 5 and 6. The shielding portion 1120 and the functional portion 112 are respectively disposed at opposite sides of the cover 10, and the shielding portion 1120 is located adjacent to the second side 104 of the cover 10. The functional portion 112 may have a substantially elongated shape. The shielding portion 1120 may correspond to a fingerprint identification module of the terminal 1000 for performing the fingerprint identification function.

In an embodiment, the terminal 1000 can further include a fingerprint identification module 800 configured to perform the fingerprint identification function. The shielding portion 1120 may define a through hole 1124 to receive the identification module 800. The hole through 1124 is configured to expose a touch-sensitive surface of the fingerprint identification module 800. A user may touch the touch-sensitive surface and input a fingerprint to facilitate fingerprint identification. In other embodiments, the through hole 1124 may also be configured to receive component such as a physical button, which is not limited herein. Furthermore, the through hole 1124 illustrated in FIG. 5 may have a rectangular shape. In other embodiments, the through hole 1124 may have other shapes such as a circle shape or an ellipse shape, and the shape of the through hole 1124 is not limited herein.

Furthermore, the display panel 20 may further include a non-display portion 23 that is not configured to display information. For example, the non-display portion 23 is in contact at an end of the display portion 21 corresponding to the shielding portion 1120. As illustrated in FIG. 6, The non-display portion 23 is located at the second edge 202 of the display panel 20, and the non-display portion 23 is opposite to the shielding portion 1120. The non-display portion 23 can be configured to receive an Integrated Circuit (IC). The IC is configured to control the information displayed by the display panel 20.

In some embodiments, as illustrated in FIG. 6, the display panel 100 further include a drive circuit 1001 electrically coupled to the display panel 20. The drive circuit 1001 is an Integrated Circuit. The drive circuit 1001 is configured to control the display panel 20. For example, the display panel 20 may include a liquid crystal layer when the display panel is a liquid crystal display. Then the drive circuit 1001 is configured to apply voltage across the liquid crystal layer, such that the liquid crystals of the liquid crystal layer can be twisted or untwisted according to the voltage. In some embodiment, the drive circuit 1001 is a planar printed circuit board. The drive circuit 1001 is arranged in a direction in which the second side 202 extends, corresponding to the non-display portion 23. In some embodiment, the drive circuit 1001 can be stacked on a side of the non-display portion 23 departing away from the cover 10, and substantially parallel to the display panel 20. By this way, the drive circuit 1001 can be hidden. In an alternative embodiment, the drive circuit 1001 can be coupled to an edge of the display portion 21 and form the non-display portion 23.

Furthermore, the display panel 20 may further define a receiving hole 1002 configured to at least partially received the fingerprint identification module 800. The receiving hole 1002 may be defined in the non-display portion 23 and may pass through the display panel 20. The receiving hole 1002 may be aligned with the through hole 1124 in the shielding portion 1120. The fingerprint identification module 800 may be coupled to the circuit board 500 or a support, and can be received in the receiving hole 1002 and the through hole 1124.

As illustrated in FIG. 2 and FIG. 3, in the illustrating embodiment, the functional portion 112 includes a first functional region 1121, a second functional region 1122, and a shielding region 1123.

The first attachment member 12 is disposed on the bottom surface 102 of the cover, and is attached to the second functional region 1122. The second attachment member 13 is disposed on the bottom surface 102 of the cover, and is attached to the shielding region 1123.

In an embodiment, the first attachment member 12 may be made from a material of a far-infrared ink. A light transmittance of the first attachment member 12 is about 85% when light having wavelength of 850 nm penetrates the first attachment member 12. Because the far-infrared ink is black, internal components of the terminal may be shielded, and infrared waves may penetrate the first attachment member 12.

The second attachment member 13 may be made from black ink. Because a transmittance of a black ink layer is substantially 0 when visible light penetrates the black ink, the second attachment member 13 may shied the internal components effectively. Therefore, the internal components of the terminal may not be seen by the user.

The camera module 200 is at least partially received in the at least one recess 22. In the illustrating embodiment, the camera module 200 is disposed on the circuit board 500 and corresponds to the position of the first functional region 1121. The camera module 200 may receive ambient light penetrating the first functional region 1121. In other words, the camera module 200 receives external ambient light penetrating the at least one recess 22 and the first functional region 1121.

In the illustrating embodiment, the camera module 200 may include two camera units, and the two camera units are respectively labeled as the first camera unit 210 and the second camera unit 220. Correspondingly, there may be two first functional regions 1121 provided, and the two first functional regions 1121 are respectively labeled as the first functional region 1121*a* and the first functional region 1121*b*. The first functional region 1121*a* and the first functional region 1121*b* correspond to the first camera unit 210 and the second camera unit 220, respectively. In other words, the first camera unit 210 faces the first functional region 1121*a*, and the second camera unit 220 faces the first functional region 1121*b*. Such that the two camera units and the two first functional regions 1121 are disposed in a one-to-one correspondence.

In some embodiment, the camera module 200 may be corresponding to the recess 22 in a one-to-one correspondence. For example, when there are camera units, two recesses 22 may be provided. In other embodiments, a plurality of camera unit may be provided and may be at least partially received in one recess 22. For example, there are one recess 22 and a plurality of camera units, and the plurality of camera units are disposed and may be at least partially receive in the recess 22, no specific limitation is imposed here.

Figure 12:
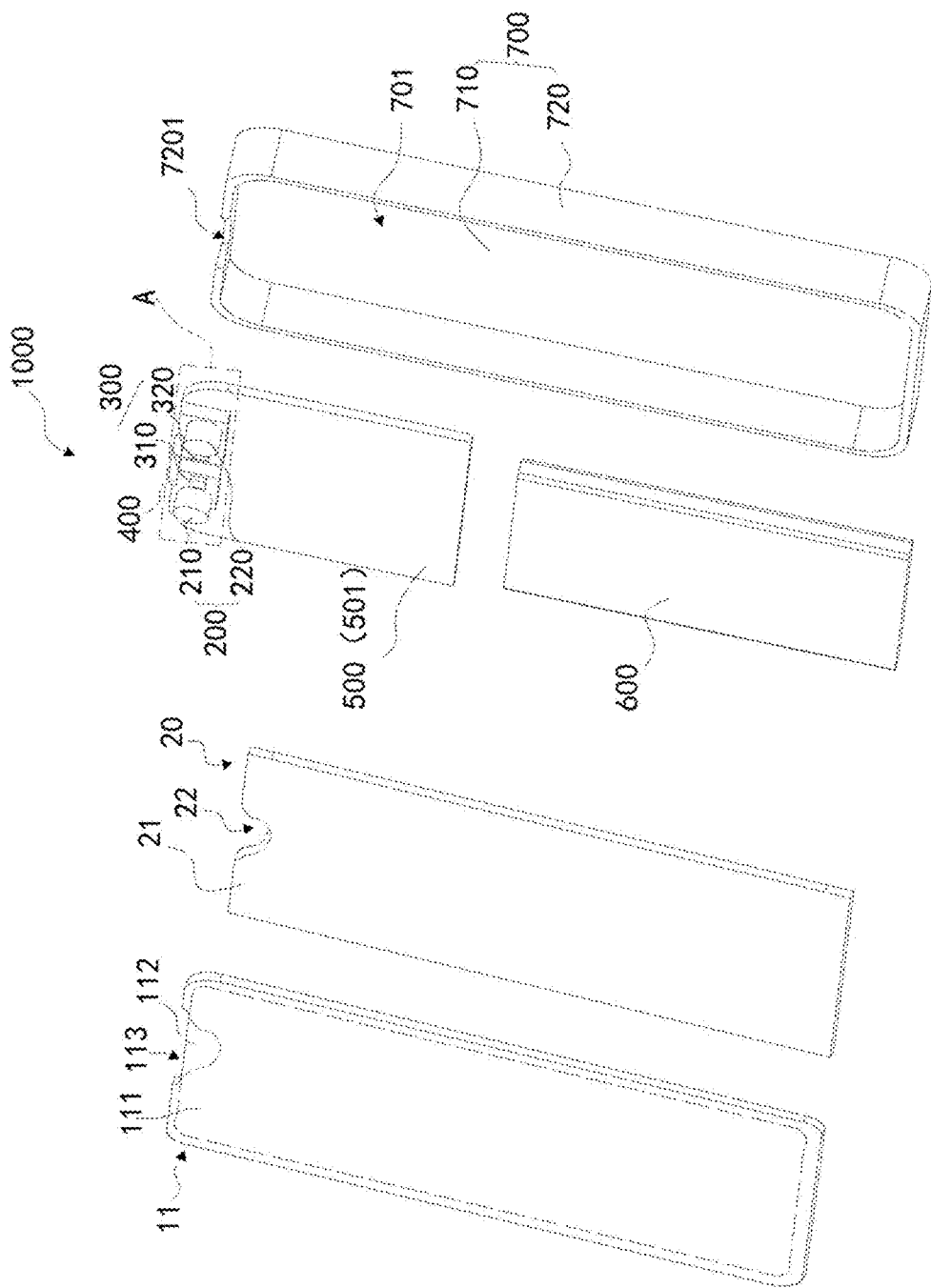
FIG. 12 illustrates a schematic exploded perspective view of a terminal, in accordance with an embodiment of the present disclosure.
Figure 13:
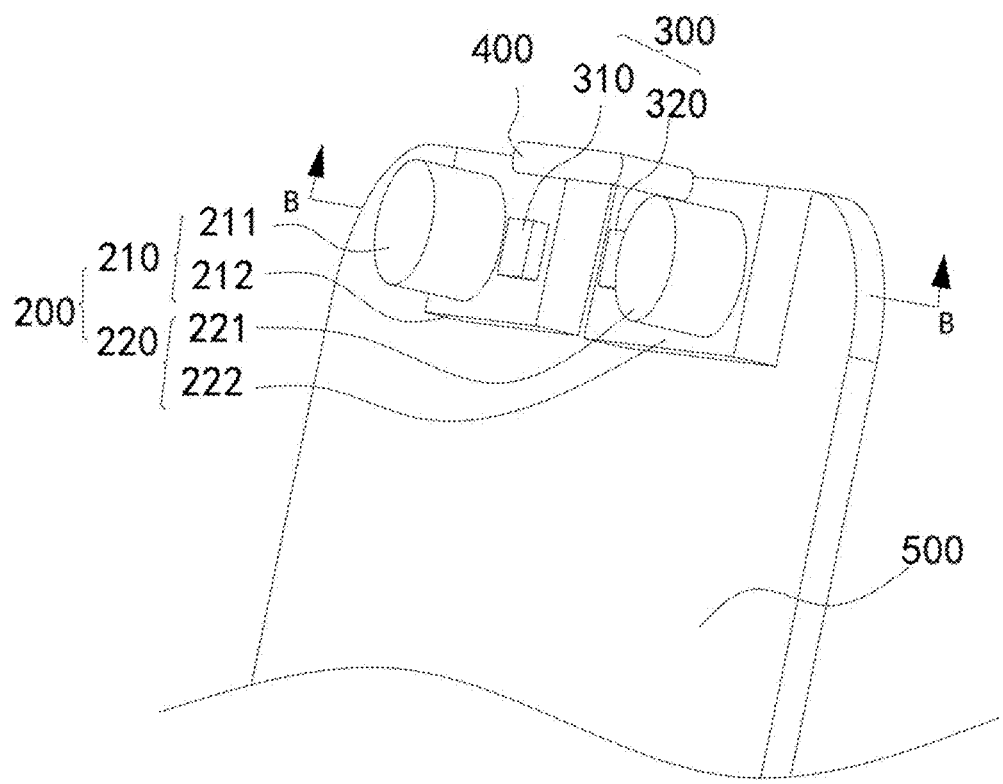
FIG. 13 illustrates an enlarged schematic view of a region A in the terminal of FIG. 12.

As illustrated in FIG. 13, FIG. 13 illustrates an enlarged schematic view of region A in the terminal of FIG. 12. In the illustrating embodiment, the camera module 200 includes a base and a lens. The base and the lens cooperatively form a step. The sensor module 300 is disposed on the step.

In some embodiment, the first camera unit 210 includes a first lens 211 and a first base 212. The first lens 211 and the first base 212 cooperatively form a first step. The first step is configured support the sensor module 300. In some embodiments, the first base 212 is coupled to the circuit board 500. The first base 212 may include a first support surface departing away from the circuit board 500. The first support surface is configured to support the sensor module 300. The first lens 211 is coupled to the first base 212 and protruding from the first support surface. An end of the first lens 211 away from the first support surface is extending and inserted into the recess 22. Such that the first camera unit 210 is at least partially received in the recess 22.

The second camera unit 220 includes a second lens 221 and a second base 222. The second lens 221 and the second base 222 cooperatively form a second step. The second step may be configured support the sensor module 300. In some embodiments, the second base 221 is coupled to the circuit board 500. The second base 221 may include a second support surface departing away from the circuit board 500. The second support surface may be configured to support the sensor module 300. The second lens 221 is coupled to the second base 221 and protruding from the second support surface. An end of the second lens 221 away from the second support surface is extending and inserted into the recess 22. Such that the second camera unit 220 is at least partially received in the recess 22.

In other embodiments, the camera module may include one or more camera unit, which is not limited herein.

The sensor module 300 is disposed adjacent to the camera module 200. The sensor module 300 is configured to detect a distance between the terminal 1000 and an external object. In the illustrating embodiment, the sensor module 300 is disposed on the camera module 200, and corresponding to the second functional region 1122 of the cover body 11. For example, the sensor module 300 may face the second shielding region 1122, and the sensor module 300 may at least partially received in the recess 22.

In the illustrating embodiment, the sensor module 300 may include two sensors, and the two sensors may be labeled as a first sensor 310 and a second sensor 320. Correspondingly, two second functional regions 1122 are provided. The two second functional regions 1122 are respectively labeled as the second functional region 1122*a* and the second functional region 1122b. The second functional region 1122a and the second functional region 1122b are respectively corresponding to the first sensor 310 and the second sensor 320. In other words, the first sensor 310 faces the second functional region 1122a, and the second sensor 320 faces the second functional region 1122b. Such that the two sensors and the two second functional regions 1122 are disposed in a one-to-one correspondence.

Figure 14:
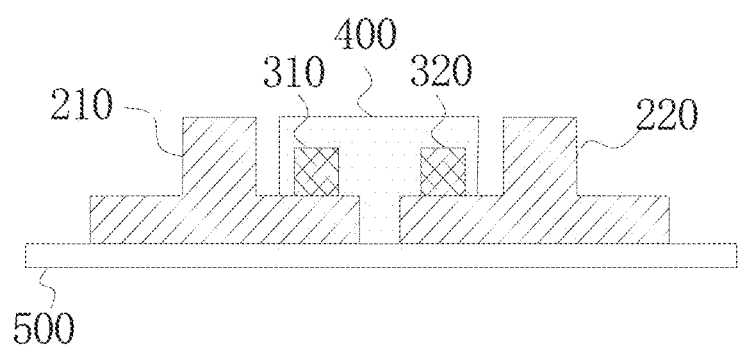
FIG. 14 illustrates a schematic cross-sectional view of the terminal of FIG. 13, taken along a line B-B.

In the illustrating embodiment, in order to describe a positional relationship of the sensor module 300 and the camera module 200 more clearly, a schematic cross-sectional view are provided, which is taken along a direction of line B-B in FIG. 13, as illustrated in FIG. 14, in accordance with an embodiment of the present disclosure.

As illustrated in FIG. 14, the first sensor 310 is disposed on the step formed by the first lens 211 and the first base 212, i.e. the first step. The second sensor 320 is disposed on the step formed by the second lens 221 and the second base 222, i.e. the second step. In this way, stepped structures formed by the camera module 300 may be fully utilized to support the sensor module 300, and an area of a non-display region of the display device 100 may be smaller, compared with ordinary display devices.

In an embodiment, the first sensor 310 may be a proximity sensor. The first sensor 310 is configured to detect a distance between the terminal and an external object, and the display panel 20 may be activated or may be turned off according to the distance. The second sensor 320 may be a light sensor. A brightness of the display panel of the terminal 1000 may be adjusted according to an intensity of ambient light. Thereby the user's eyes are protected from viewing the screen that is too bright or too dark.

It is to be understood that in other embodiments, the first sensor 310 and the second sensor 320 may also be other kinds of sensors, which are not limited herein. In some embodiments, the sensor module 300 may also include one sensor, three or more sensors, a number of the sensor module 300 may be provided according to actual needs.

Figure 15:
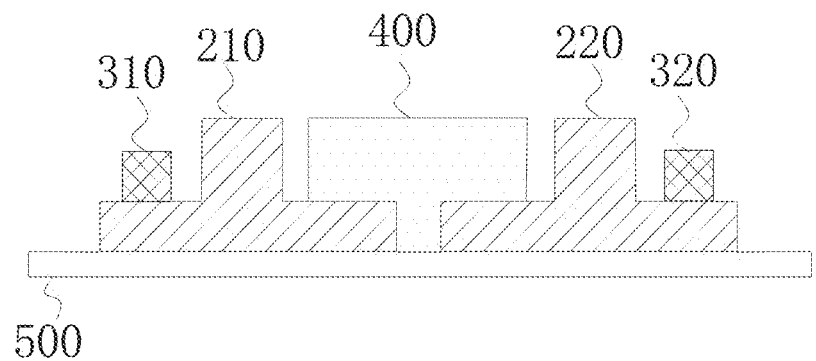
FIG. 15 illustrates a schematic view of an arrangement of a camera module and a sensor module of the terminal of FIG. 12, in accordance with an embodiment of the present disclosure.

In an embodiment, the sensor module 300 and the camera module 200 may be arranged in a straight line. As illustrated in FIGS. 13 to 15, three arrangements of the sensor module 300 and the camera module 200 are illustrated, in which the sensor module 300 and the camera module 200 are arranged in a linear alignment:

In the arrangement of the sensor module 300 and the camera module 200 illustrated in FIG. 14, the first sensor 310 and the second sensor 320 are disposed between the first camera unit 210 and the second camera unit 220.

In the arrangement of the sensor module 300 and the camera module 200 illustrated in FIG. 15, the first camera unit 210 and the second camera unit 220 are disposed between the first sensor 310 and the second sensor 320.

Figure 16:
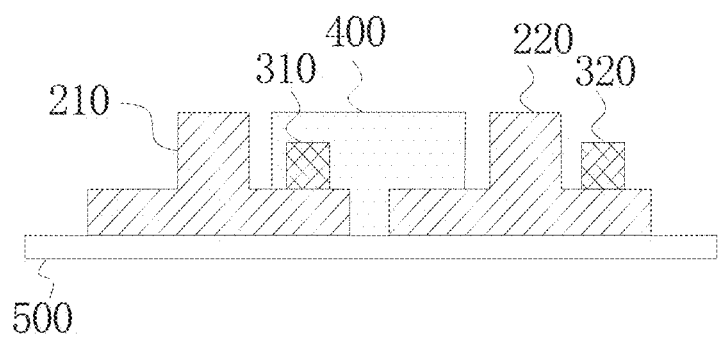
FIG. 16 illustrates a schematic view of an arrangement of the camera module and the sensor module of the terminal, in accordance with another embodiment of the present disclosure.

In the arrangement of the sensor module 300 and the camera module 200 illustrated in FIG. 16, the first sensor 310 and the second sensor 320 are arranged in an interval manner with the first camera unit 210 and the second camera unit 220. In other words, two sensors and the two camera units are arranged in an interval manner. It may be understood that, as illustrated in FIG. 16, the first sensor 310 may be located at a right side of the first camera unit 210, and the second sensor 320 may be located at a left side of the second camera unit 220.

Figure 17:
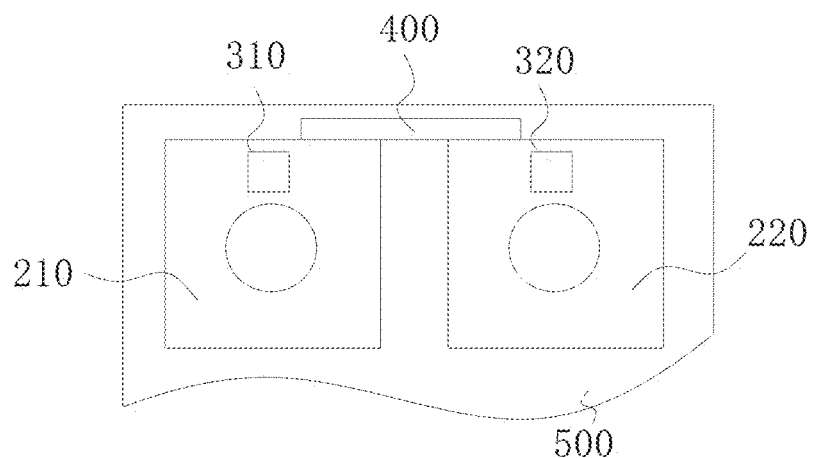
FIG. 17 illustrates a schematic view of an arrangement of the camera module and the sensor module of the terminal, in accordance with still another embodiment of the present disclosure.
Figure 18:
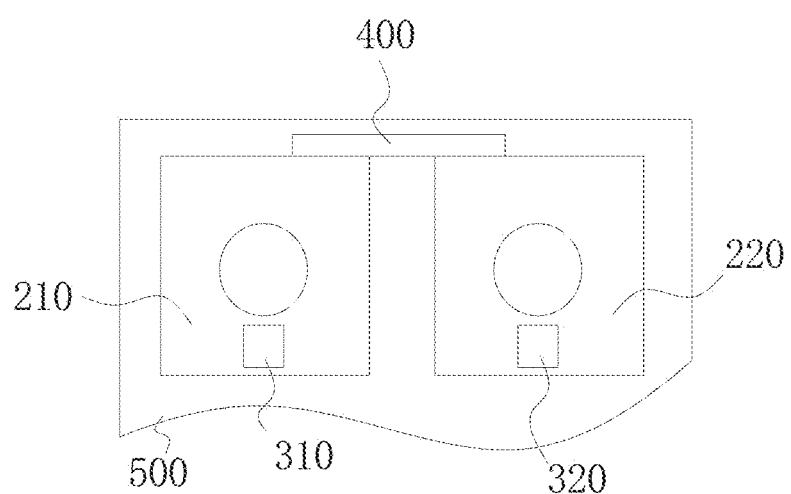
FIG. 18 illustrates a schematic view of an arrangement of the camera module and the sensor module of the terminal, in accordance with further another embodiment of the present disclosure.

In an embodiment, the sensor module 300 and the camera module 200 may also be arranged in a parallel manner, as illustrated in FIG. 17 and FIG. 18.

As illustrated in FIGS. 16-17, the first sensor 310 and the second sensor 320 are located above or below the first camera unit 210 and the second camera unit 220, respectively. In some embodiment, the first camera unit 210 is closer to an edge of the display panel 20 than the first sensor 310. The second camera unit 220 is closer to an edge of the display panel 20 than the second sensor 320. In an alternative embodiment, the first sensor 310 is closer to an edge of the display panel 20 than the first camera unit 210. The second sensor 330 is closer to an edge of the display panel 20 than the second camera unit 220.

It may be understood that, in other embodiments, the arrangement of the sensor module 300 and the camera module 200 is not limited to the arrangements mentioned above, and the sensor module 300 and the camera module 200 may be arranged in other manners. For example, the first sensor 310 may also be located at an upper left corner of the camera module 210, the second sensor 320 may also be located at an upper right corner of the second camera unit 220.

In some embodiment, the telephone receiver 400 is disposed at a top edge of the circuit board 500, and coupled to the circuit board 500. In the illustrating embodiment, the telephone receiver 400 of the terminal 1000 is disposed above the camera module 200 and the sensor module 300, as illustrated in FIGS. 11 to 17. In some embodiment, the telephone receiver 400 is closer to an edge of the display panel 20 than the camera module 200 and the sensor module 300.

In the terminal illustrated in FIG. 12, the housing 700 includes a bottom plate 710 and a frame 720 disposed at periphery of the bottom plate 710. The bottom plate 710 is substantially a planar plate parallel to the display panel 20. The frame 720 is substantially a rectangular frame. The frame 720 extends in a direction perpendicular to the bottom plate 710. In other words, the frame 720 is coupled to edges of the bottom plate 710 and surrounds the bottom plate 710. The frame portion 41 and the bottom plate 43 cooperatively define a receiving cavity of the housing 40. Such that the housing 700 can be configured to receive components such as the camera module 200, the sensor module 300, the telephone receiver 400, the circuit board 500, the battery 600, and the display panel 20.

In an embodiment, the frame 720 of the housing 700 may define a sound outlet 7201, such that the sound emitted by the telephone receiver 400 may propagate to outside the terminal 1000. The sound outlet 7201 corresponds to the telephone receiver 400. When the telephone receiver 400 is disposed in an upper portion of the terminal 1000, i.e. the telephone receiver 400 is disposed above the camera module 200 and the sensor module 300, and the sound outlet 7201 is defined in an upper portion of the frame 720 corresponding to the camera module 200 and the sensor module 300. The sound outlet 7201 is configured to allow the sound from the telephone receiver 400 to propagate. For example, the telephone receiver 400 is adjacent to the frame 720, and the sound outlet 7201 passes through the frame 720 and aligned to the telephone receiver 400. The telephone receiver 400 is exposed from the sound outlet.

In an embodiment, as illustrated in FIG. 11, a top portion of the cover body 11 may define a notch 113, such that the sound emitted by the telephone receiver 400 may propagate the recess portion 113. The notch 113 is located at an upper edge of the functional portion 112. For example, the notch 113 can be defined in the first side 103 of the cover 10, and may extend towards and contact with the functional portion 112. The telephone receiver 400 is adjacent to the first side 103 of the cover 10, and the notch 113 passes through the cover body 11 and aligned to the telephone receiver 400. The telephone receiver 400 is exposed from the notch 113.

When the cover body 11 is fastened to the housing 700 of the terminal 100, the notch 113 and the housing 700 cooperatively form a slit configured to allow the sound from the telephone receiver 400 to propagate. It may be understood that a shape of the notch 113 is not limited to the shape illustrated in FIG. 11, and the shape of the notch 113 may be other desired shaped according to actual conditions, which is not limited herein. In some embodiment, the frame 720 may defines the sound outlet 7201 while the cover body 11 defines the notch 113. The notch 113 may communicate with the sound outlet 7201. In some alternative embodiment, one of the sound outlet 7201 and the notch 113 can be omitted. For example, the frame 720 may defines the sound outlet 7201 to allow the sound from the telephone receiver 400 to propagate. Or the cover body 11 defines the notch 113 to allow the sound from the telephone receiver 400 to propagate.

In the illustrating embodiment, the battery 600 is configured to supply power to components such as the display panel 20, the camera module 200 on the circuit board 500, the sensor module 300, the telephone receiver 400.

It may be understood that the components of the terminal 1000 are not limited to the above, and the terminal 1000 may also include other components such as a radio frequency circuit, a memory, a wireless fidelity module, a processor. It will be understood by those skilled in the art that terminal structures illustrated in FIG. 12 does not constitute a limitation of the terminal 1000. The terminal 1000 may include more components than those illustrated, or combine some components, or different component arrangements.

In accordance with embodiments of the present disclosure, the terminal 1000 may reduce an area of regions of the display panel 20, which is corresponding to the components such as the camera module 200 and the sensor module 300. Therefore, a ratio of the display region to the display panel is larger. Thereby the terminal may be able to display with a display panel with a larger size.

In the above, although the present disclosure has been disclosed in the above preferred embodiments, the preferred embodiments are not intended to limit the disclosure. Those skilled in the art may make various modifications without departing from the principle and scope of the disclosure. The scope of protection of the present disclosure is determined by the scope defined by the claims.

What is claimed is:

1. A terminal comprising
a support;
a camera module having a base and a lens, the base being disposed on the support, the lens protruding from the base such that the lens and the base cooperatively form a step;
a sensor module disposed on the base and configured to determine a distance between the terminal and an external object;
a cover body including a transparent portion, a shielding portion, and a functional portion, the shielding portion and the functional portion respectively connected to opposite sides of the transparent portion; and
a display panel disposed between the support and the cover body, the display panel including:
a display portion configured to display information, the display portion covered by the transparent portion; and
a non-display portion in contact with an end of the display portion and being covered by the shielding portion;
a drive circuit stacked on the non-display portion, wherein the drive circuit is sandwiched between the non-display portion and the shielding portion, and parallel with the display panel;
wherein the display panel defines at least one recess at an edge of the display portion, and the at least one recess is covered by the functional portion; the lens is at least partially received in the at least one recess.

2. The terminal of claim 1, wherein the at least one recess is at least partially surrounded by the display portion.

3. The terminal of claim 1, further comprising a fingerprint identification module; wherein the shielding portion defines a through hole therein; the fingerprint identification module is at least partially received in the through hole and is exposed outside the through hole.

4. The terminal of claim 1, wherein; the drive circuit is parallel to the display panel.

5. The terminal of claim 1, further comprising a telephone receiver coupled to the support; wherein the cover body defines a notch corresponding to the telephone receiver; the notch passing through the cover body, and the telephone receiver being exposed from the notch.

6. The terminal of claim 5, wherein the functional portion is disposed adjacent to an edge of the cover body, the notch being defined at the edge of the cover body; the notch extending towards, and being in contact with, the functional portion.

7. The terminal of claim 5, further comprising a housing, the support being disposed in the housing; the housing comprising a bottom plate and a frame disposed at a periphery of the bottom plate; the frame defining a sound outlet communicating with the notch; and the telephone receiver being exposed from the sound outlet and the notch.

8. The terminal of claim 1, wherein the terminal further comprises attachment members attached to the functional portion and facing the camera module and the sensor module.

9. The terminal of claim 8 wherein the functional portion comprises a first functional region corresponding to the camera module and a second functional region corresponding to the sensor module; the attachment members comprise a first attachment member attached to the second functional region.

10. The terminal of claim 9, wherein the functional portion further comprises a shielding region surrounding the first functional portion and the second functional portion; the attachment members further comprise a second attachment member attached to the shielding region.

11. The terminal of claim 10, wherein the material of the first attachment member includes far infrared ink; the material of the second attachment member includes black ink.

12. The terminal of claim 1, wherein the camera module comprises two camera units, and the sensor module comprises two sensors; the two camera units and the two sensors are arranged on the support in an interval manner.

13. A terminal, comprising
a support;
a camera module and a sensor module, disposed on the support and adjacent to each other;
a cover comprising a transparent portion, a shielding portion, and a functional portion; the shielding portion and the functional portion respectively connected to opposite sides of the transparent portion; and a display panel sandwiched between the support and the cover; wherein the display panel comprises:
- a display portion configured to display information, the display portion being covered by the transparent portion; and
- a non-display portion in contact with an end of the display portion, and disposed below the shielding portion;

a drive circuit stacked on the non-display portion, wherein the drive circuit is sandwiched between the non-display portion and the shielding portion, and parallel with the display panel;

wherein the display panel defines at least one recess; the camera module is at least partially received in the at least one recess; the functional portion covering the recess.

14. The terminal of claim 13, wherein the functional portion comprises a first functional region corresponding to the camera module, and a second functional region corresponding to the sensor module; the first functional region is transparent; the second functional region is covered by a far infrared ink layer.

15. The terminal of claim 14, wherein the functional portion further comprises a shielding region surrounding the first functional portion and the second functional portion; the shielding region is covered by a black ink layer.

16. A terminal, comprising:
- a cover, comprising a transparent portion, a shielding portion, and a functional portion;
- the shielding portion and the functional portion connecting to opposite sides of the transparent portion;
- a display panel, disposed between the support and the cover; wherein the display panel comprises:
  - a display portion, configured to display information, the display portion being covered by the transparent portion, the display panel defining a recess at an aged of the display portion, and the recess is covered by the functional portion; and
  - a non-display portion, being in contact with an end of the display portion and being covered by the shielding portion;
- a circuit board, electrically coupled to the display panel; the display panel being sandwiched between the cover plate and the circuit board thereby the cover covering the functional recess;
- a camera module, electrically coupled to the printed circuit board, and having a base and a lens; wherein the base is disposed on and connected to the circuit and the lens connected to the base and protrudes from the base, thus the lens and the base cooperatively form a step; an end of the lens away from the base is inserted into the recess;
- a sensor module, disposed on the base and electrically coupled to the printed circuit board; and
- a drive circuit, stacked on a side of the non-display portion departing away from the cover, and substantially parallel with the display panel.

17. The terminal of claim 16, wherein the functional portion comprises a first functional region corresponding to the camera module, and a second functional region corresponding to the sensor module; the first functional region is transparent; the second functional region is covered by a far infrared ink layer.

18. The terminal of claim 16, wherein the functional portion further comprises a shielding region surrounding the first functional portion and the second functional portion; the shielding region is covered by a black ink layer.

19. The terminal of claim 16, wherein the camera module comprises two camera units, and the sensor module comprises two sensors; the two camera units and the two sensors are arranged on the support in an interval manner.

20. The terminal of claim 16, further comprising a telephone receiver coupled to the support; wherein the cover defines a notch corresponding to the telephone receiver; the notch passes through the cover, and the telephone receiver is exposed from the notch.

* * * * *